United States Patent
Bainville et al.

(10) Patent No.: US 11,822,921 B2
(45) Date of Patent: *Nov. 21, 2023

(54) COMPRESSION ASSIST INSTRUCTIONS

(71) Applicant: Apple Inc., Cupertino, CA (US)

(72) Inventors: Eric Bainville, Sunnyvale, CA (US); Ali Sazegari, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/054,017

(22) Filed: Nov. 9, 2022

(65) Prior Publication Data

US 2023/0121984 A1 Apr. 20, 2023

Related U.S. Application Data

(63) Continuation of application No. 17/373,144, filed on Jul. 12, 2021, now Pat. No. 11,537,399, which is a continuation of application No. 16/566,344, filed on Sep. 10, 2019, now Pat. No. 11,086,625.

(51) Int. Cl.
*G06F 9/30* (2018.01)
*H03M 7/30* (2006.01)

(52) U.S. Cl.
CPC ...... *G06F 9/30145* (2013.01); *G06F 9/30036* (2013.01); *G06F 9/30098* (2013.01); *H03M 7/3059* (2013.01); *H03M 7/3082* (2013.01); *G06F 9/30018* (2013.01)

(58) Field of Classification Search
CPC .......................... G06F 9/30018; G06F 9/30036
See application file for complete search history.

(56) References Cited

U.S. PATENT DOCUMENTS

| | | | |
|---|---|---|---|
| 4,490,786 A | 12/1984 | Nakatani | |
| 5,751,981 A | 5/1998 | Witt et al. | |
| 6,958,718 B2 | 10/2005 | Symes et al. | |
| 8,972,697 B2 | 3/2015 | Sperber et al. | |
| 9,904,548 B2 | 2/2018 | Ould-Ahmed-Vall et al. | |
| 11,086,625 B2 | 8/2021 | Bainville et al. | |
| 11,537,399 B2* | 12/2022 | Bainville | G06F 9/30098 |

(Continued)

FOREIGN PATENT DOCUMENTS

JP 2002-522821 A 7/2002

OTHER PUBLICATIONS

Intel® 64 and IA-32 Architectures Software Developer's Manual vol. 2 (2A, 2B, 2C & 2D): Instruction Set Reference, A-Z; 34 pages; May 2019.

(Continued)

*Primary Examiner* — Zachary K Huson
(74) *Attorney, Agent, or Firm* — Kowert, Hood, Munyon, Rankin & Goetzel, P.C.

(57) ABSTRACT

In an embodiment, a processor supports one or more compression assist instructions which may be employed in compression software to improve the performance of the processor when performing compression/decompression. That is, the compression/decompression task may be performed more rapidly and consume less power when the compression assist instructions are employed then when they are not. In some cases, the cost of a more effective, more complex compression algorithm may be reduced to the cost of a less effective, less complex compression algorithm.

20 Claims, 8 Drawing Sheets

(56) References Cited

U.S. PATENT DOCUMENTS

| | | |
|---|---|---|
| 2005/0028070 A1 | 2/2005 | Lin et al. |
| 2013/0024654 A1 | 1/2013 | Gove |
| 2017/0177353 A1 | 6/2017 | Ould-Ahmed-Vall |
| 2018/0210733 A1 | 7/2018 | Stephens et al. |
| 2019/0369992 A1 | 12/2019 | Plotnikov |

OTHER PUBLICATIONS

Intel® Architecture Instruction Set Extensions and Future Features Programming Reference; 319433-037 May 2019; 8 pages.
ISRWO, PCT/US2020/049707, dated Dec. 16, 2020, 18 pages.
Anonymous: "advanced Micro Devices AMD64 Technology AMD64 Architecture Programmer's Manual vol. 6: 128-Bit an d 256-Bit XOP and FMA4 Instructions", Nov. 30, 2009 (Nov. 30, 2009), XP055574031, Retrieved from the Internet: URL:https://www.amd.com/system/fles/TechDocs/43479.pdf [retrieved on Mar. 25, 2019] p. 130-p. 132.
IPRP/WO PCTUS2020049707, dated Mar. 24, 2022, 11 pages.
IN Patent Office, IN Patent Application No. 202217011126, First Examination Report, dated Jul. 12, 2022, 7 pages.
Office Action in UK Patent Application No. 2202417.8 dated Dec. 9, 2022, 4 pages.
AMD64 Technology, AMD64 Architecture Programmer's Manual, vol. 6: 128-Bit and 256-Bit, XOP and FMA4, Instructions; publ. No. 43479, revision 3.04, Nov. 2009, pp. 130-132.
Office Action in Japanese Appl. No. 2022-515076 dated Apr. 24, 2023, 4 pages.

\* cited by examiner

COMPRESSION ASSIST INSTRUCTIONS

The present application is a continuation of U.S. application Ser. No. 17/373,144, entitled "Compression Assist Instructions," filed Jul. 12, 2021, which is a continuation of U.S. application Ser. No. 16/566,344, entitled "Compression Assist Instructions," filed Sep. 10, 2019 (now U.S. Pat. No. 11,086,625); the disclosures of each of the above-referenced applications are incorporated by reference herein in their entireties.

BACKGROUND

Technical Field

Embodiments described herein are related to processors and, more particularly, to compression assist instructions in processors to improve compression/decompression performance and power efficiency.

Description of the Related Art

Compression is used for a variety of reasons in computing devices. For example, software downloads may be compressed for delivery over a network, and may be decompressed on the target computing device for installation. In some cases, such as portable computing devices (e.g., smart phones, portable digital assistants, tablet computers, etc.), the software may be decompressed, installed, then recompressed for storage on the device. Storing various software in compressed form may save storage space on the device, which may be more limited than the storage in larger computing devices such as laptops, desktops, servers, etc.

Compression/decompression is primarily implemented in software, and thus the cost in performance (and power consumption, on portable devices with limited power supplies such as batteries) can be significant. The effectiveness of a compression algorithm is generally measured in terms of the ratio of the size of the uncompressed original to the size of the compressed result, referred to as the compression ratio. Unfortunately, the effectiveness of a given compression algorithm is generally correlated to its complexity, and thus the cost of effectiveness is performance (e.g., latency) and power.

SUMMARY

In an embodiment, a processor supports one or more compression assist instructions which may be employed in compression software to improve the performance of the processor when performing compression/decompression. That is, the compression/decompression task may be performed more rapidly and consume less power when the compression assist instructions are employed then when they are not. In some cases, the cost of a more effective, more complex compression algorithm may be reduced to the cost of a less effective, less complex compression algorithm.

BRIEF DESCRIPTION OF THE DRAWINGS

The following detailed description makes reference to the accompanying drawings, which are now briefly described.

Figure 1:
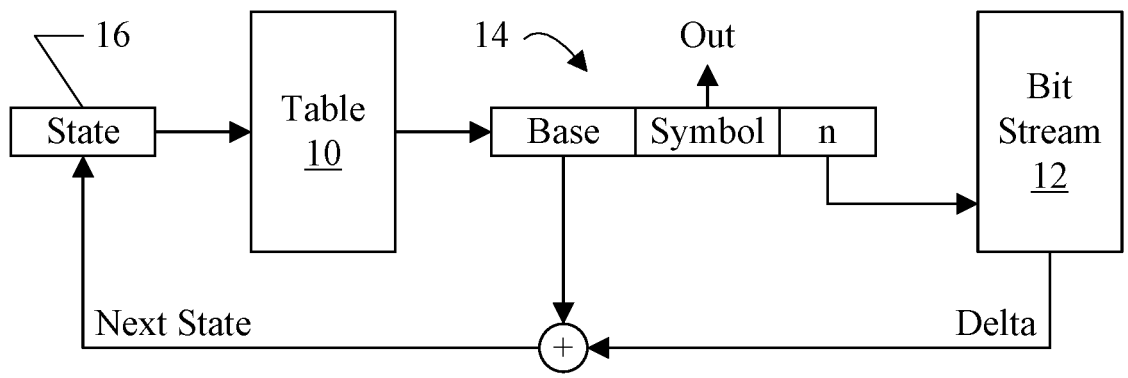
FIG. 1 is a block diagram of one embodiment of decompression based on a Finite State Entropy (FSE) compression algorithm.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to." As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be said to be "configured" to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

This specification may use the words "a" or "an" to refer to an element, or "the" to refer to the element. These words are not intended to mean that there is only one instance of the element. There may be more than one in various embodiments. Thus, "a", "an", and "the" should be interpreted to mean "one or more" unless expressly described as only one.

This specification may describe various components, units, circuits, etc. as being coupled. In some embodiments, the components, units, circuits, etc. may be coupled if they are electrically coupled (e.g., directly connected or indirectly connected through one or more other circuits) and/or communicatively coupled.

DETAILED DESCRIPTION OF EMBODIMENTS

As mentioned above, a processor implementing various embodiments of compression assist instructions is disclosed. Generally, a compression assist instruction may be an instruction designed to improve the performance of the processor when performing compression and/or decompression. Thus, a compression assist instruction may be an instruction expected to be used only in decompression, in some cases. In other cases, a compression assist instruction may be expected to be used only in compression, or in both compression and decompression.

To illustrate the compression assist instructions and their application, several implementations of the Finite State Entropy (FSE) compression algorithm are shown. While FSE is used as an example, and mechanism that employs one or more bit streams or bit stacks as part of the compression may benefit from the compression assist instructions described below.

FIG. 1 is a block diagram of one embodiment of decompression of FSE-compressed data. As shown in FIG. 1, the data includes a table 10 and a bit stream 12. That is, when the data was compressed using the FSE compression algorithm, the table 10 and the bit stream 12 were generated. An initial state may be used to lookup an initial entry in the table. That is, the state (illustrated at reference numeral 16) may be an index into the table 10. Each entry may include data similar to that shown at reference numeral 14. Particularly, the entry may include a base, a symbol, and a number of bits (n). The symbol is part of the output data, and may be provided to be assembled with previously read symbols to produce an output data stream that is the original data. That is, the symbol is part of the original data and may be concatenated to the end of the data stream (or in the case of the initial state, may initialize the data stream). The number of bits (n) may specify a number of bits to be consumed from the bit stream 12 to provide a delta value to be added to the base to generate the next state. The next state replaces the initial state and looks up a table entry, from which the next symbol and next state may be generated. Repeating the next state generation, lookup, and symbol output continuously may produce a symbol stream that is the uncompressed original data. At some point, an entry in the table may indicate that the end of the data has been reached. Alternatively, the uncompressed data may be a fixed size and thus the next state generation, look up, and symbol output may occur a fixed number of times (assuming a fixed-size symbol).

The embodiment of FIG. 1 is a fairly serial process, and thus may be relatively slow. Various embodiments may perform a more parallel operation. For example, in FIG. 2, 4 states may be looked up in parallel. The four states 24 may correspond to four interleaved FSE symbol streams that share the same decoder table 26. That is, the symbol streams may be independent of each other, but interleaved in the bit stack 20. Other embodiments may implement more or fewer parallel states/symbol streams, as desired. Each state 24 may read a table entry 22 from a table 26. Each table entry 22 may be similar to the table entry 14 shown in FIG. 1. Each of the 4 table entries 22 read in parallel may provide a symbol, which may be concatenated with the corresponding output symbol stream (or to initialize the corresponding output symbol streams, for the initial states 24). Each entry consumes its specified number of bits (n) from the bit stack 20 (where the entry at the top in FIG. 2 reads the bits at the top of the bit stack 20, the next entry down reads the next bits from the bit stack 20, etc.). Thus, as mentioned above, the bit stack 20 may have interleaved bit fields for the symbol streams. The result deltas are added to the bases from the respective entry 22 to generate the next states 24.

Figure 3:
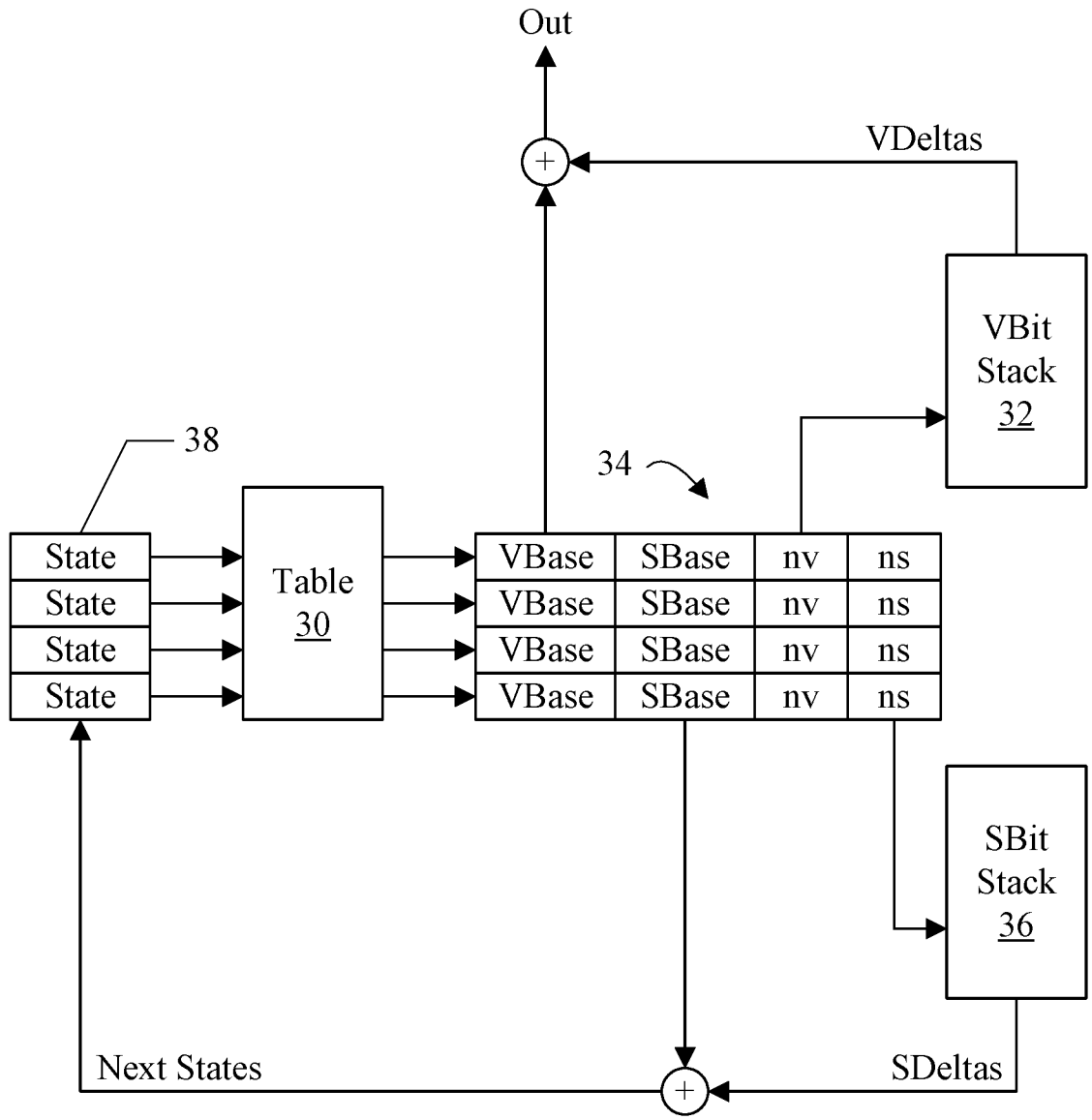
FIG. 3 is a block diagram of another embodiment of optimization of decompression based on the FSE algorithm in which multiple interleaved FSE symbol and value streams share the same decoder table.

FIG. 3 illustrates another embodiment of a parallelized form of the FSE algorithm. In the embodiment of FIG. 3, instead of storing the symbols directly in a table 30, the symbols may be generated from a base value read from a table 30 (the value base, or VBase) and a delta read from another bit stack 32 (the value bit stack, or VBit stack 32) may be used to generate the symbols. That is, each symbol may correspond to a range of values beginning at VBase, and the particular value at a given point in the decode process is determined by reading the delta from the VBit stack 32 and adding it to the VBase. The table entries 34 may thus include a VBase and a number of bits (nv) to consume from the VBit stack 32 to be used as deltas (VDeltas) to add to the VBase to generate the output symbol from the entry. Additionally, each entry 34 may include a state base (SBase) and a number of bits (ns) to read from a state bit stack 36 (SBit stack 36) to form deltas (SDeltas) to add to the SBase from each entry to generate the next states 38. In an embodiment, the VBit stack 32 and the SBit stack 36 may be implemented as a single bit stack, with the VBits and the SBits interleaved in the stack. In still other embodiments, a combination of interleaving of Vbits and Sbits in a stack and implementing multiple stacks may be used. For example, a set of 16 symbol streams may be represented as 4 sets of 4 interleaved symbol streams (e.g., 4 bit stacks).

Figure 2:
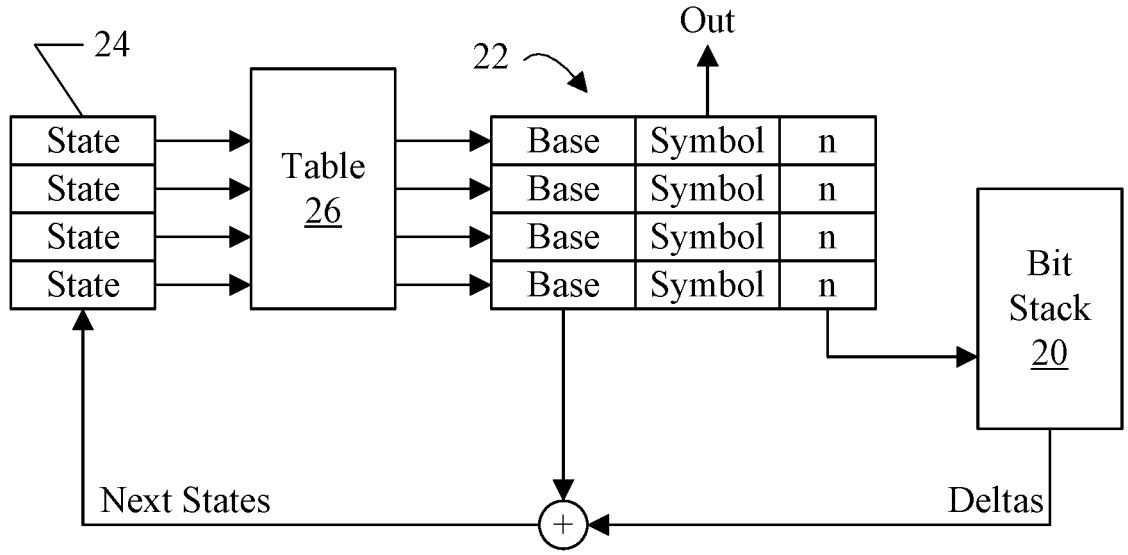
FIG. 2 is a block diagram of one embodiment of optimization of decompression based on the FSE algorithm in which multiple interleaved FSE symbol streams share the same decoder and bit stream.

One way to perform the decompression shown in FIG. 2 or 3 in a processor that includes vector instructions would be to use vector operations. For example, if vectors of 4 vector elements are supported by a processor, the embodiments of FIGS. 2 and 3 could perform the table look up, next state generation, and symbol value generation using one vector instruction for each operation involved in the table look up, next state generation, and symbol value generation. However, the bit stack read operations may be more difficult to vectorize using standard vector instructions.

Generally, vector operations perform a specified operation on a plurality of vector elements in one or more vector operands in parallel and independently for each vector element. For example, a vector add operation may add vector elements in corresponding positions within the vector operands, producing sums as vector elements of a vector result operand. A four element vector would have vector elements VE0, VE1, VE2, and VE3, in the listed order in adjacent vector element positions within the vector. A vector add would add the VE0 elements of the source operands to produce the VE0 element of the result operand; add the VE1 elements of the source operands to produce VE1 element of the result operand; etc. While a four element vector is used as an example, other embodiments may employ different numbers of vector elements per vector and/or may support multiple numbers of vector elements per vector. For example, a 128 bit vector register set could support 2 64-bit vector elements, 4 32-bit vector elements, 8 16-bit vector elements, and 16 8-bit vector elements. Various vector instructions may be defined to use the vector registers as vector elements of different sizes.

Thus, vector operations/instructions perform well on vector elements that are the same size, and many operations may be performed in parallel to improve performance of vectorizable algorithms. The bit stack read operations (and corresponding bit stack write operations during compression) may be variable size operations, however. Each bit stack read may be any number of bits, from 1 (or possibly even 0 bits) to the largest number of bits supported by the algorithm. For example, in one embodiment of the algorithm in FIG. 3, bit stack reads from 1 to 32 bits may be supported. Implementing the bit stack as fixed size elements (e.g., 32 bits in the example) would significantly reduce the compression ratio achievable for the algorithm and thus would be counterproductive.

In order to enhance the use of vector operations to perform compression and decompression for compression algorithms similar to that shown in FIGS. 1-3, compression assist instructions have been defined to perform the bit stack read and write operations, transferring data from the bit stack to vector elements (bit stack read) and from vector elements to packed bit stack data (bit stack write).

Figure 4:
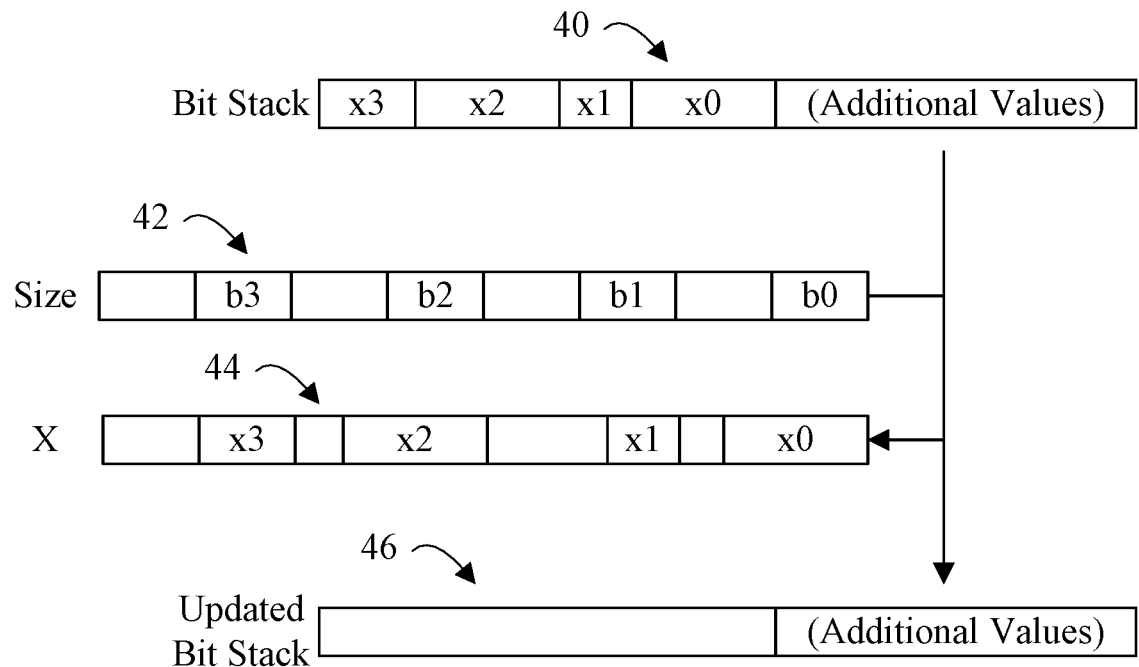
FIG. 4 is a block diagram illustrating one embodiment of a bit stack read operation.
Figure 5:
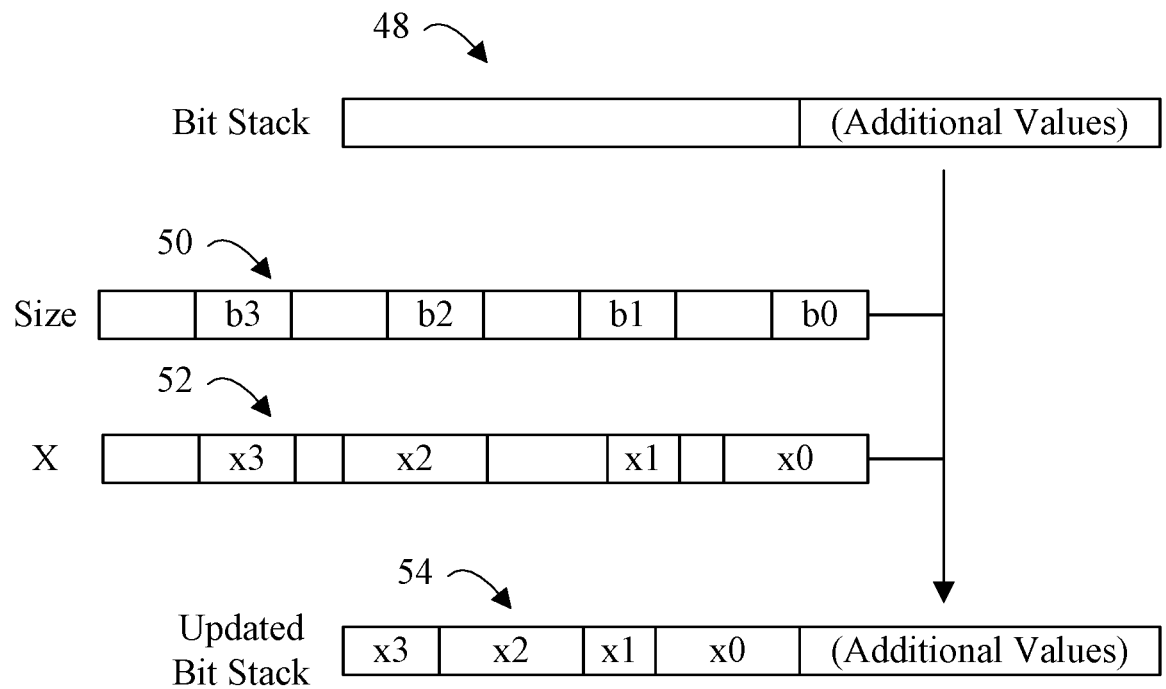
FIG. 5 is a block diagram illustrating one embodiment of a bit stack write operation.

FIGS. 4-5 illustrate the bit stack read operation and bit stack write operation to and from vector registers, for one embodiment. The compression assist instructions have been defined to cause the processor (when executing the compression assist instructions) to interpret the data in one or more vector registers storing operands of the instruction as bit stack data rather than vector elements. Thus, a portion of the bit stack may be loaded into a vector register and processed using the compression assist instructions defined herein. Any vector register may be specified as such an operand; it is the coding of the vector register as a particular operand of a compression assist instruction that causes the processor to interpret the register data as bit stack data instead of vector elements.

FIG. 4 illustrates a bit stack read operation. A portion of a bit stack 40 including the top of the bit stack is shown in FIG. 4. The top of the bit stack may be on the left in FIG. 4, and may include deltas x3 (top of stack), x2 (next to top of stack), x1, and x0 as well as additional values below those. The widths of x3, x2, x1, and x0 in FIG. 4 vary to illustrate that each value is one or more bits and may vary. A first vector register 42 has four vector elements storing the sizes of the top four deltas on the stack (b3 corresponding to x3, b2 corresponding to x2, etc.). The register 42 may be loaded from the fields "n" in FIG. 2 for a given table read based on a set of next states, or from the filed "nv" or "ns" in FIG. 3 for a given table read. For the embodiment of FIG. 3, two vector registers may be used, one for "nv" and one for "ns." Generally, a vector load instruction or instructions may perform the table read, and there may be additional vector instructions to isolate the size values in the register 42 to perform the bit stack read.

Based on the sizes in the register 42, the bit fields x3, x2, x1, and x0 may be extracted from the top of the bit stack into a result vector register 44, and the bit stack may be updated to remove the extracted bit fields. Thus, the updated stack 46 in FIG. 4 includes the remaining additional values at the top of the stack. The stacks 40 and 46 may illustrate the values in memory, such that the top of the stack moves in memory. When the top of the stack is loaded into a register, as will be described below, the bit stack read may include shifting the new top of the stack left in the register (e.g., so that the most significant bit, or MSB, of the register has the bit at the top of the stack).

Bit stack read operations may be part of the decompression process. Creating the bit stack may include bit stack write operations, as the compression algorithm determines the symbols and generates the table entries and bit stack. FIG. 5 illustrates a bit stack write operation.

The initial bit stack 48 in FIG. 5 includes the additional values at the top of the stack, similar to the updated bit stack 46 in FIG. 4. Space is shown to the left of the top of the bit stack 48 in FIG. 4 to illustrate pushing more bit fields into the bit stack as part of the bit stack write. A vector register 50 may be coded with vector elements corresponding to the size of each bit field (b3 corresponding to x3, b2 corresponding to x2, etc.). Another vector register 52 may have the bit fields as vector elements (x3, x2, etc.). Vector registers 50 and 52 may be computed according to the compression algorithm, using other vector instructions. The bit stack write operation concatenates the bit fields x3, x2, x1, and x0, making them adjacent in the bit stack, and writes the bit fields to the top of the bit stack, producing the updated bit stack 54 shown in FIG. 5.

To implement the bit stack read operation illustrated in FIG. 4, a processor as described herein may include a pair of compression assist instructions. These instructions are referred to herein as "top" and "pop." The top instruction, when executed, may cause the processor to extract a plurality of bit fields from a top of the bit stack (which may be stored in a vector register, as discussed below) into vector elements of a result vector register. The pop instruction, when executed, may cause the processor to remove the bit fields from the top of the stack, moving the top of the stack down to the next set of bit fields that have not been extracted using a top instruction.

Figure 6:
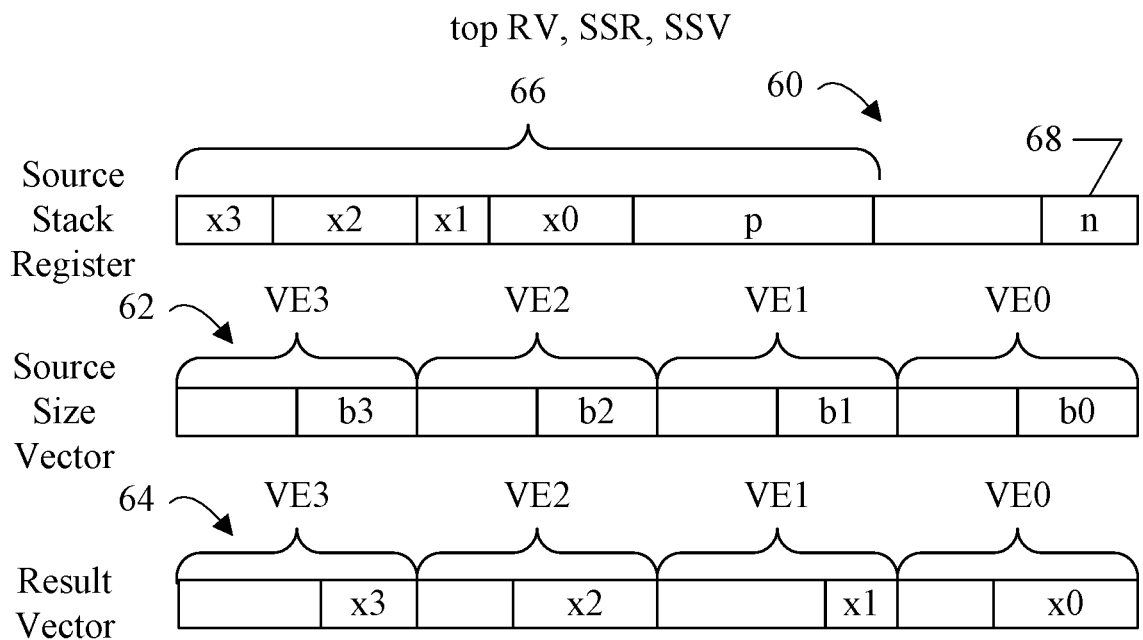
FIG. 6 is a block diagram illustrating register inputs and outputs for one embodiment of a top decompression assist instruction.

FIG. 6 is a block diagram of the source operands and result operand of the top instruction, for one embodiment. At the top of FIG. 6, a mnemonic for the top instruction is shown with a result vector register (RV), a source stack register (SSR), and a source size vector register (SSV). The source stack register contents are illustrated at reference numeral 60, the source size vector register contents are illustrated at reference numeral 62, and the result vector register contents after execution of the top instruction are illustrated at reference numeral 64.

As mentioned previously, the stack register may be a vector register, but the processor may interpret the contents differently by virtue of the register being specified as a stack operand of one of the compression assist instructions. When the vector register is storing bit stack data, the register may include a bit stack field 66 and a bit count field 68. The bit stack field maybe a plurality of bits, with the MSB of the plurality of bits in the MSB of the register in this embodiment. The MSB of the plurality of bits may be the top bit of the bit stack. The bit count field 68 may be the number of bits currently in the stack register (e.g., the number of the plurality of bits in the bit stack field 66). In one embodiment, the vector register may be 128 bits and the bit count field may be 8 bits. Thus, the bit stack field 66 may be up to 120 bits in this embodiment. Other embodiments may implement different size vector registers and support larger or smaller bit stack fields and bit count fields.

Within the bit stack field 66, the bit fields x3, x2, x1, and x0 are identified in FIG. 6. The bit fields are defined by the sizes in the source size vector register 62. More particularly, the source size vector register 62 may be a vector of sizes. That is, the sizes may be counts of the number of bits in the corresponding bit fields. The sizes may be integers, for example. In the illustrated embodiment, there are four vector elements in the source size vector 62: vector element 3 (VE3), VE2, VE1, and VE0. Each vector element specifies a size of a corresponding bit field. Thus, the bit field x3 may be the most significant b3 bits of the bit stack field 66. The bit field x2 may be adjacent to the bit field x3 (e.g., the MSB of bit field x2 may be adjacent to the least significant bit, or LSB, of the bit field x3) and may be b2 bits in size. The bit field x1 may be adjacent to the bit field x2 and may be b1 bits in size, and the bit field x0 may be adjacent to the bit field x1 and may be b0 bits in size. The remaining bits in the bit stack field 66 are labeled "p" in FIG. 6. The MSB of p may be the MSB of the next bit field in the bit stack, which may be defined by the next table read from the table 26 or 30. While the size fields in the register 62 are shown as occupying a portion on the vector elements in FIG. 6, the fields may occupy up to the entire vector elements. Furthermore, the extracted bit fields in the result vector register 64 may be up to the full size of the vector elements, although the size of each individual field is controlled by the corresponding vector element from the size vector.

Based on the size fields in the source size vector register 62, the processor executing the top instruction may be configured to extract the bit fields into correspond vector elements of the result vector register 64. Thus, x3 is element VE3 of the result vector register 64, extracted based on size b3 in VE3 of the source size vector register 62; x2 is element VE2 of the result vector register 64, extracted based on size b2 in VE2 of the source size vector register 62 and also affected by b3 since x3 is extracted from the MSBs of the bit stack field 66 in parallel; x1 is element VE1 of the result vector register 64, extracted based on size b1 in VE1 of the source size vector register 62 and also affected by b3 and b2; and x0 is element VE0 of the result vector register 64, extracted based on size b0 in VE0 of the source size vector register 62 and also affected by b3, b2, and b1.

Figure 7:
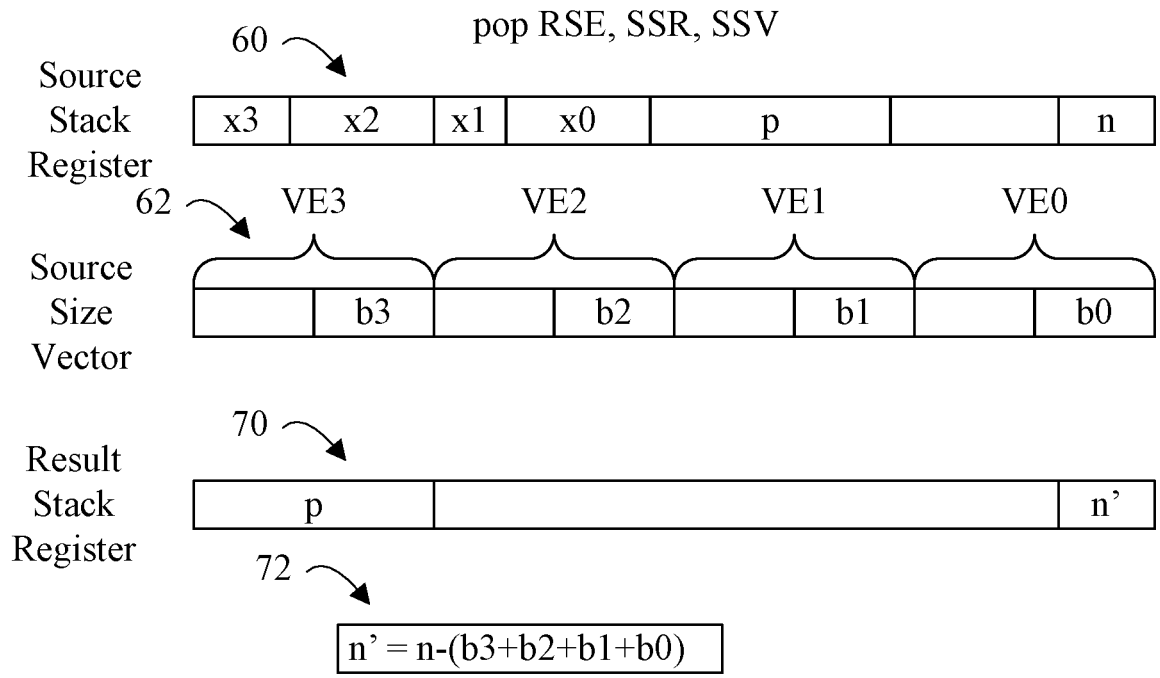
FIG. 7 is a block diagram illustrating register inputs and outputs for one embodiment of a pop decompression assist instruction.

FIG. 7 is a block diagram of the source operands and result operand of the pop instruction, for one embodiment. At the top of FIG. 7, a mnemonic for the pop instruction is shown with a result stack register (RSR), the source stack register (SSR), and the source size vector register (SSV). The source stack register contents are illustrated at reference numeral 60, the source size vector register contents are illustrated at reference numeral 62, and the result stack register contents after execution of the pop instruction are illustrated at reference numeral 70. The pop instruction may be intended to be paired with the top instruction, to adjust the contents of the bit stack to reflect extraction and consumption of the bit fields x3, x2, x1, and x0. Thus, the same source registers 60 and 62 are shown. However, the pop instruction may generally be coded with any source registers.

As mentioned, a processor executing the pop instruction removes the bits corresponding to the bit fields consumed by the top instruction. Thus, the pop instruction may use the sum of the size vector elements b3, b2, b1, and b0 from the source size vector register 62 to identify the number of bits to remove, beginning with the MSB of the register. The remaining bits (p) may be shifted so that the MSB of p is the MSB of the result stack register 70. Additionally, the bit count field (n') may be computed as illustrated at reference numeral 72, by subtracting the sum of the size vector elements from the bit count field n in the source stack register 60.

It is noted that the result stack register 70 may be coded to be the same register as the source stack register 60 in the pop instruction, thus updating the source stack register 60 for the next stack read operation using the top instruction to extract the next set of bit fields. As the bit stack field in the stack register becomes depleted, it may be refilled from the remaining bit stack in the memory via a load instruction. A vector load instruction may be used, since the vector load instruction may merely load the data into the register. It is the use of the register as a stack register operand that causes the processor to interpret the contents as a bit stack instead of vector elements.

The top and pop instructions may be compression assist instructions that may be useful for decompression. In some embodiments, one or more compression assist instructions may be defined for compression as well. Particularly, compression assist instructions may be defined for the bit stack write operation illustrated in FIG. 5. In one embodiment, two compression assist instructions are defined: "create" and "concat."

Figure 8:
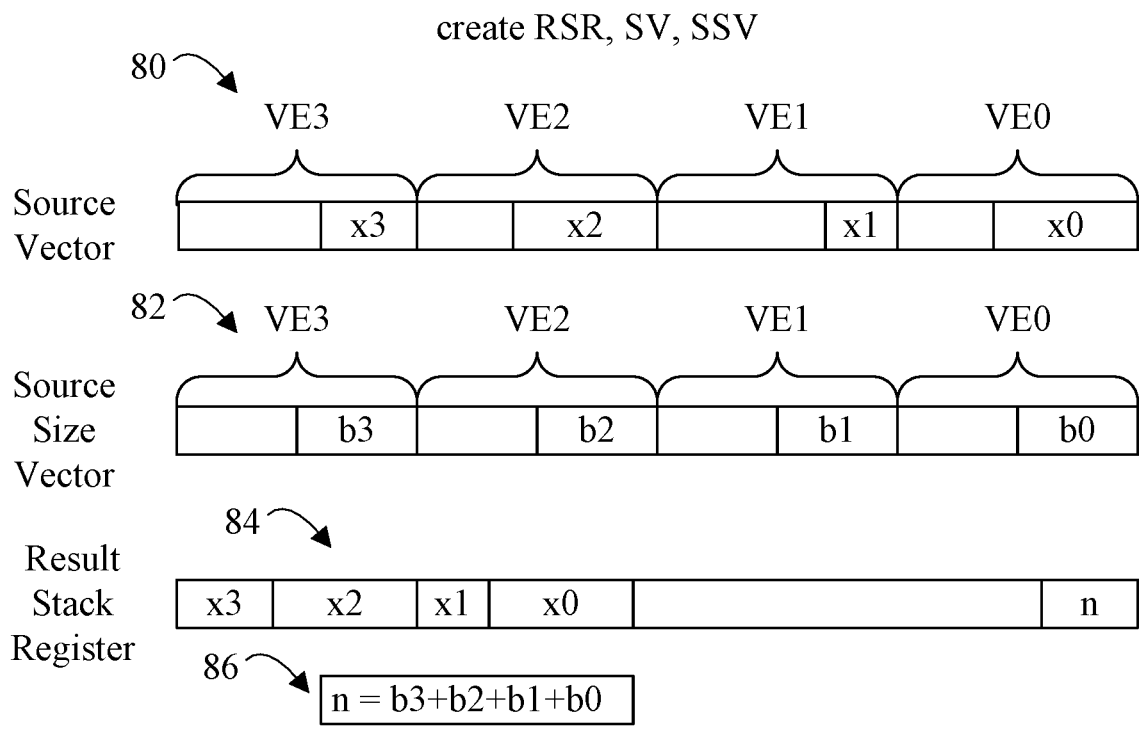
FIG. 8 is a block diagram illustrating register inputs and outputs for one embodiment of a create compression assist instruction.

FIG. 8 is a block diagram of the source operands and result operand of the create instruction, for one embodiment. At the top of FIG. 8, a mnemonic for the create instruction is shown with a result stack register (RSR), a source vector register (SV), and a source size vector register (SSV). Various vector instructions may be executed to generate a vector of bit fields and corresponding sizes, which may be in a source vector register 80 and a source size vector register 82 when the bit stack write operation is ready to be performed. The registers 80 and 82 are shown in FIG. 8, and include vector elements storing the bit fields (register 80) and corresponding vector elements storing the sizes (register 82). Thus, VE3 of the register 80 is a bit field x3 of size b3 (VE3 of the register 82), VE2 of the register 80 is a bit field x2 of size b2 (VE2 field of the register 82), etc. When a processor executes the create instruction, the processor may pack the bit fields from the source vector register 80 into the MSBs of the result stack register 84, forming a plurality of bits in the MSB s of the result stack register 84 that include the bit fields x3, x2, x1, and x0 in adjacent bit positions within the plurality of bits (e.g. the LSB of x3 is adjacent to the MSB of x2, the LSB of x2 is adjacent to the MSB of x1, etc.). The bit count field "n" may be computed as a sum of the size vector elements from the register 82, as illustrated at reference numeral 86.

The create instruction creates a plurality of bits from a vector of bit fields. The concat instruction may be used to insert the result of the create instruction into a previous version of the bit stack (e.g., pushing the plurality of bits onto the bit stack). The concat instruction may also be used in bit stack read operations, to refill a depleted bit stack register from memory. For example, a next portion of the bit stack may be loaded from memory into a vector register, and may be concatenated into the bit stack register being used for bit stack reads.

Figure 9:
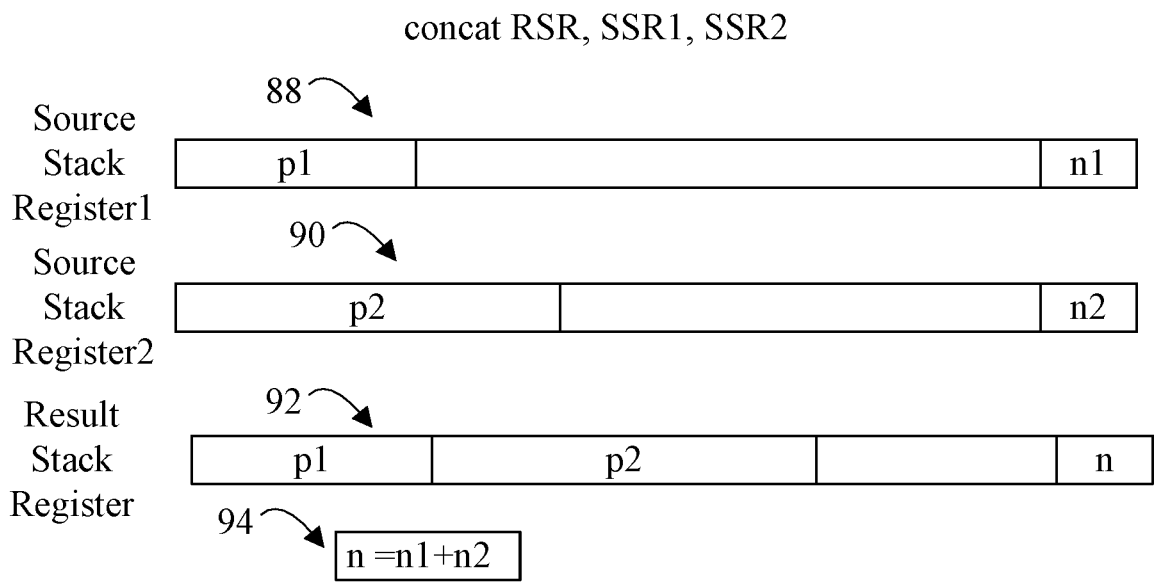
FIG. 9 is a block diagram illustrating register inputs and outputs for one embodiment of a concat compression assist instruction.

FIG. 9 is a block diagram of the source operands and result operand of the concat instruction, for one embodiment. At the top of FIG. 9, a mnemonic for the concat instruction is shown with a result stack register (RSR), a source stack register1 (SSR1), and a source stack register 2 (SSR2). The source stack registers 1 and 2 are illustrated at reference numerals 88 and 90, respectively. Each source stack register may include a plurality of bits (p1 in register 88, p2 in register 90) and a bit count field indicate a number of the plurality of bits (n1 in register 88, n2 in register 90). The processor executing the concat instruction may concatenate the p2 bits to the p1 bits, creating a larger plurality of bits as shown in the result stack register 92. The bit count filed in the result stack register may be computed as shown at reference numeral 94, as the sum of the bit count fields n1 and n2.

While the embodiments of FIGS. 6-9 illustrate vectors with 4 vector element, other embodiments may support vectors with more or fewer vector elements (e.g., 2, 8, 16, etc.). Additionally, as mentioned previously, some embodiments may support multiple versions of the vector instructions, including the compression assist instructions, to use vectors with different numbers of vector elements (or an operand such as an immediate field may select how many vector elements are in the vector for that instruction).

Figure 10:
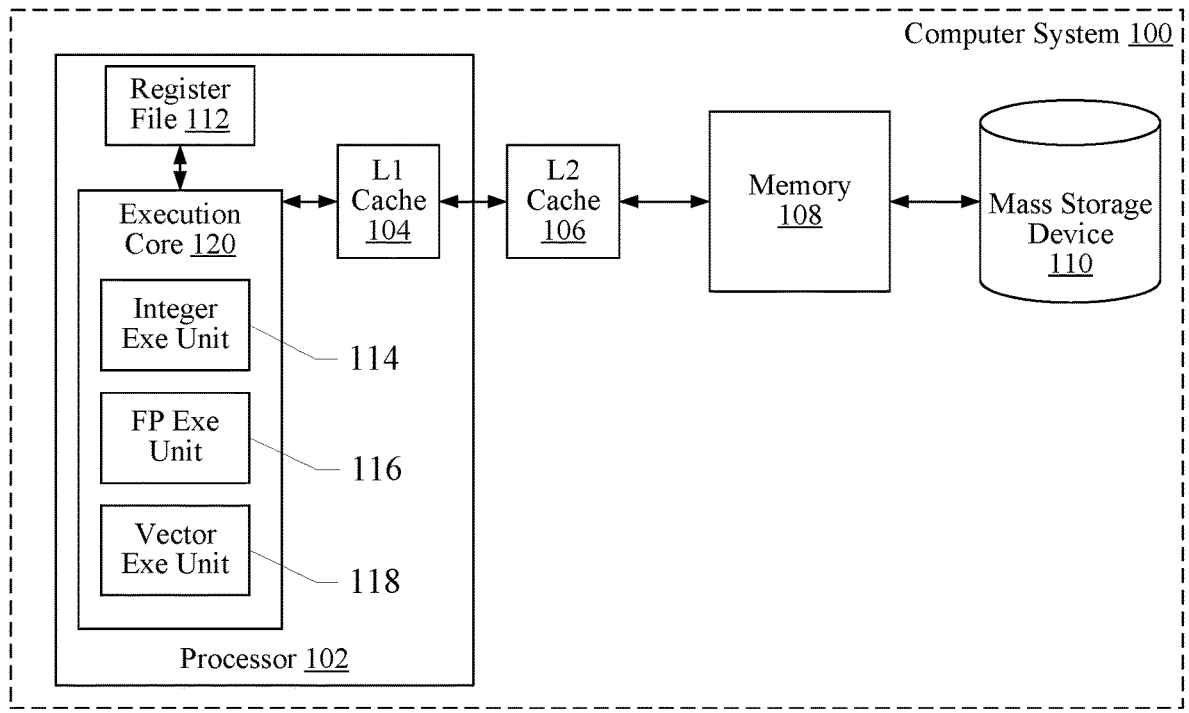
FIG. 10 is a block diagram of one embodiment of a system including a processor.

FIG. 10 is a block diagram of one embodiment of a computer system 100. The computer system 100 includes a processor 102, a level two (L2) cache 106, a memory 108, and a mass-storage device 110. As shown, the processor 102 includes a level one (L1) cache 104 and an execution core 120 coupled to the L1 cache 104 and a register file 112. The execution core 120 may include one or more execution units such as an integer execution unit 114, a floating point (FP) execution unit 116, and a vector execution unit 118 as shown. The execution units 114, 116, and 118 may be coupled to the register file 112, and/or there may be multiple register files 112 for different operand types, in various embodiments. It is noted that although specific components are shown and described in computer system 100, in alternative embodiments different components and numbers of components may be present in computer system 100. For example, computer system 100 may not include some of the memory hierarchy (e.g., L2 cache 104, memory 108 and/or mass-storage device 110). Multiple processors similar to the processor 102 may be included. Multiple execution units of a given type (e.g., integer, floating point, vector, load/store, etc.) may be included and the number of execution units of a given type may differ from the number of execution units of another type. Additionally, although the L2 cache 106 is shown external to the processor 102, it is contemplated that in other embodiments, the L2 cache 106 may be internal to the processor 102. It is further noted that in such embodiments, a level three (L3) cache (not shown) may be used. In addition, the computer system 100 may include graphics processors, video cards, video-capture devices, user-interface devices, network cards, optical drives, and/or other peripheral devices that are coupled to processor 102 using a bus, a network, or another suitable communication channel (all not shown for simplicity).

In various embodiments, the processor 102 may be representative of a general-purpose processor that performs computational operations. For example, the processor 102 may be a central processing unit (CPU) such as a microprocessor, a microcontroller, an application-specific integrated circuit (ASIC), or a field-programmable gate array (FPGA). The processor 102 may be a standalone component, or may be integrated onto an integrated circuit with other components (e.g., other processors, or other components in a system on a chip (SOC), etc.). The processor 102 may be a component in a multichip module (MCM) with other components.

More particularly, as illustrated in FIG. 1, the processor 102 may include the execution core 120. The execution core 120 may be configured to execute instructions defined in an instruction set architecture implemented by the processor 102. The execution core 120 may have any microarchitectural features and implementation features, as desired. For example, the execution core 120 may include superscalar or scalar implementations. The execution core 120 may include in-order or out-of-order implementations, and speculative or non-speculative implementations. The execution core 120 may include any combination of the above features. The implementations may include microcode, in some embodiments. The execution core 120 may include a variety of execution units, each execution unit configured to execute operations of various types (e.g., the integer execution unit 114, the floating point execution unit 116, the vector execution unit 118, a load/store execution unit (not shown) etc.). The execution core 120 may include different numbers of pipeline stages and various other performance-enhancing features such as branch prediction. The execution core 120 may include one or more of instruction decode units, schedulers or reservations stations, reorder buffers, memory management units, I/O interfaces, etc.

The register file 112 may include a set of registers that may be used to store operands for various instructions. The register file 112 may include registers of various data types, based on the type of operand the execution core 120 is configured to store in the registers (e.g., integer, floating point, vector, etc.). The register file 112 may include architected registers (i.e., those registers that are specified in the instruction set architecture implemented by the processor 102). Alternatively or in addition, the register file 112 may include physical registers (e.g., if register renaming is implemented in the execution core 120).

The L1 cache 104 may be illustrative of any caching structure. For example, the L1 cache 104 may be implemented as a Harvard architecture (separate instruction cache for instruction fetching and data cache for data read/write by execution units for memory-referencing ops), as a shared instruction and data cache, etc. In some embodiments, load/store execution units may be provided to execute the memory-referencing ops.

An instruction may be an executable entity defined in an instruction set architecture implemented by the processor 102. There are a variety of instruction set architectures in existence (e.g., the x86 architecture original developed by Intel, ARM from ARM Holdings, Power and PowerPC from IBM/Motorola, etc.). Each instruction is defined in the instruction set architecture, including its coding in memory, its operation, and its effect on registers, memory locations, and/or other processor state. A given implementation of the instruction set architecture may execute each instruction directly, although its form may be altered through decoding and other manipulation in the processor hardware. Another implementation may decode at least some instructions into multiple instruction operations for execution by the execution units in the processor 102. Some instructions may be microcoded, in some embodiments. Accordingly, the term "instruction operation" may be used herein to refer to an operation that an execution unit in the processor 102/execution core 120 is configured to execute as a single entity. Instructions may have a one to one correspondence with instruction operations, and in some cases an instruction operation may be an instruction (possibly modified in form internal to the processor 102/execution core 120). Instructions may also have a one to more than one (one to many) correspondence with instruction operations. An instruction operation may be more briefly referred to herein as an "op."

The mass-storage device 110, memory 108, L2 cache 10, and L1 cache 104 are storage devices that collectively form a memory hierarchy that stores data and instructions for processor 102. More particularly, the mass-storage device 110 may be a high-capacity, non-volatile memory, such as a disk drive or a large flash memory unit with a long access time, while L1 cache 104, L2 cache 106, and memory 108 may be smaller, with shorter access times. These faster semiconductor memories store copies of frequently used data. Memory 108 may be representative of a memory device in the dynamic random access memory (DRAM) family of memory devices. The size of memory 108 is typically larger than L1 cache 104 and L2 cache 106, whereas L1 cache 104 and L2 cache 106 are typically implemented using smaller devices in the static random access memories (SRAM) family of devices. In some embodiments, L2 cache 106, memory 108, and mass-storage device 110 are shared between one or more processors in computer system 100.

In some embodiments, the devices in the memory hierarchy (i.e., L1 cache 104, etc.) can access (i.e., read and/or write) multiple cache lines per cycle. These embodiments may enable more effective processing of memory accesses that occur based on a vector of pointers or array indices to non-contiguous memory addresses.

It is noted the data structures and program instructions (i.e., code) described below may be stored on a non-transitory computer-readable storage device, which may be any device or storage medium that can store code and/or data for use by a computer system (e.g., computer system 100). Generally speaking, a non-transitory computer-readable storage device includes, but is not limited to, volatile memory, non-volatile memory, magnetic and optical storage devices such as disk drives, magnetic tape, compact discs (CDs), digital versatile discs or digital video discs (DVDs), or other media capable of storing computer-readable media now known or later developed. As such, mass-storage device 110, memory 108, L2 cache 10, and L1 cache 104 are all examples of non-transitory computer readable storage media.

As mentioned above, the execution core 120 may be configured to execute vector instructions (e.g., in the vector execution unit 118). The vector instructions may be defined as single instruction-multiple-data (SIMD) instructions in the classical sense, in that they may define the same operation to be performed on multiple data elements in parallel. The data elements operated upon by an instance of an instruction may be referred to as a vector. The data elements forming the vector may be referred to as vector elements. Vector elements themselves may have any data type (e.g., integer, floating point, etc.) and more than one data type may be supported for vector elements.

In one embodiment, the register file 112 may include vector registers that can hold operand vectors and result vectors. In some embodiments, there may be 32 vector registers in the vector register file. However, in alternative embodiments, there may be different numbers of vector registers and/or different numbers of bits per register. Furthermore, embodiments which implement register renaming may include any number of physical registers that may be allocated to architected vector registers. Architected registers may be registers that are specifiable as operands in vector instructions.

More particularly, the vector execution unit 118 may be configured to execute the compression assist instructions described herein (or ops decoded from the compression assist instructions), in addition to various vector operations such as arithmetic operations, logic, operations, shifts, etc.

Figure 11:
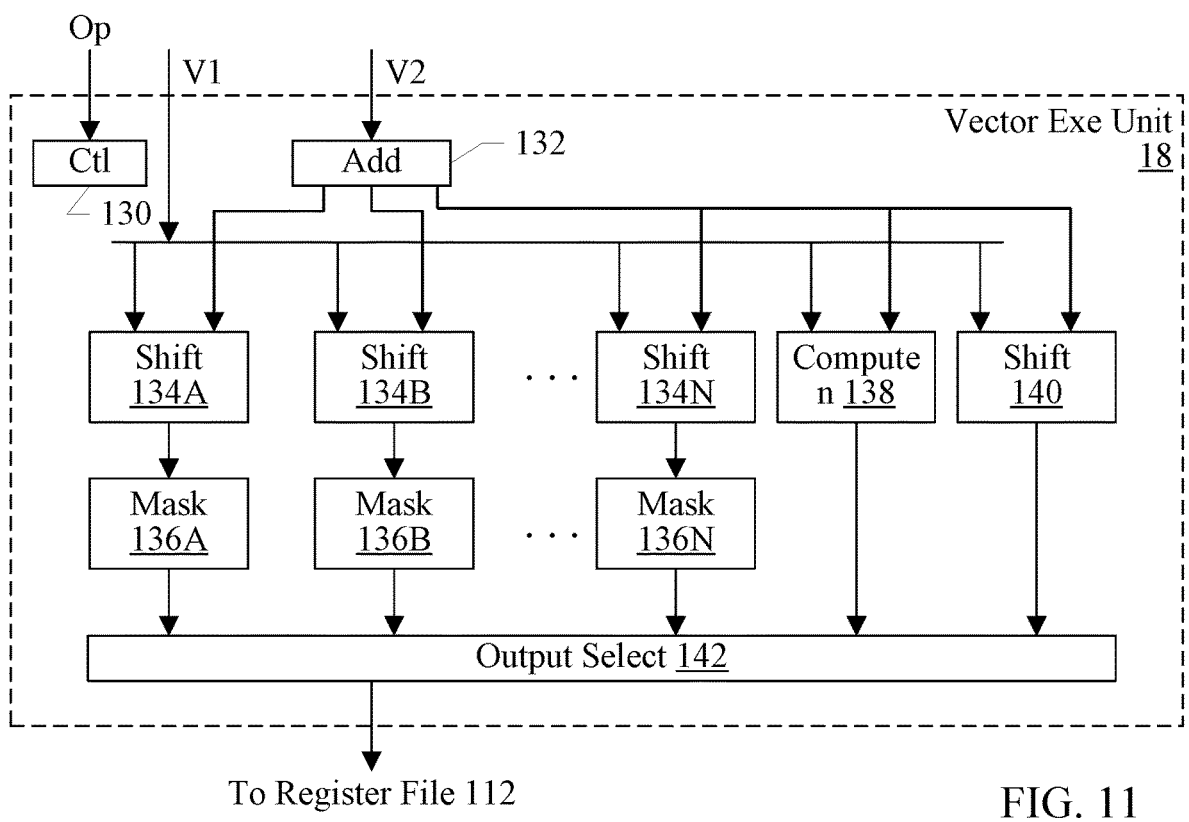
FIG. 11 is a block diagram of one embodiment of a vector execution unit shown in FIG. 10.

FIG. 11 is a block diagram of one embodiment of at least a portion of the vector execution unit 118, including circuitry configured to execute various compression assist instructions. The circuitry shown in FIG. 11 may include circuitry that is shared with other types of vector operations and/or circuitry that is dedicated to the compression assist instructions, or any combination thereof. The vector execution unit 118 is coupled to inputs for the op to be executed, as well as the source operands V1 and V2. The result operation may be specified as part of the op and may be forwarded with the result to the register file 112.

A control circuit 130 may receive the op and may control the other circuitry in the vector execution unit 118 accordingly. Thus, the control circuit 130 may be coupled to the other circuitry shown in FIG. 11, although the connections are not expressly illustrated in FIG. 11 to avoid complicating the drawing. An adder circuit 132 may be provided, which may be coupled to the second source operand V2. The adder circuit 132 may be configured to add various elements of the vector V2. For example, when the source operand V2 is a size vector, sums of the sizes may be used during execution of the op. The sum of all the vector elements may be used in the update of the bit count field (n), when the result operand is a stack register. Additionally, partial sums of the vector elements may be used as well.

For example, the top instruction may be implemented by right shifting the MSBs of the stack based on the partial sums and the size of the vector elements. In the four vector element case, if vector elements are 32 bits in size, a right shift of the 32 MSBs by 32-b3 may align x3 to the VE3 element in the result vector (e.g., a right shift by the vector element size (Vs)-b3). Similarly, a right shift of the 64 MSBs by 64-(b3+b2) may align x2 to the VE2 element in the result vector (e.g. 2Vs-(b3+b2)); a right shift of the 96 MSBs by 96-(b3+b2+b1) may align x2 to the VE1 element in the result vector (e.g. 3Vs-(b3+b2+b1)); and a right shift of the 128 MSBs by 128-(b3+b2+b1+b0) may align x0 to the VE0 element in the result vector (e.g. 4Vs-(b3+b2+b1+b0)). Other element sizes and numbers of elements may be implemented similarly. Thus, the shift circuits 134A-134N may be coupled to V1 operand and to respective sums from the adder circuit 132 to execute the top instruction. Corresponding mask circuits 136A-136N may be coupled to the outputs of the shift circuits 134A-134N to mask the bits that are not part of the vector elements (e.g., since x3 and x2 are adjacent in the source stack registers, some of the bits of x3 may be in MSBs of the VE2 element after the shift and may be masked). While individual shift circuits 134A-134N and mask circuits 136A-136N are shown in FIG. 11, other embodiments may implement a shared shift circuit with control inputs from the control circuit 130 to control the shifts for each vector element position, based on the size of a given vector. That is, the shared shift circuit may be defined to perform 2 64-bit shifts, 4 32-bit shifts, 8 16-bit shifts, or 16 8-bit shifts based on the size of the vector elements of a given operand. The control inputs may select the correct shifts to be performed based on the size selected for a given op. The shift circuits 134A-134N and the mask circuits 136A-136N may thus be one implementation of extraction of bit fields from the plurality of bits in the source stack register to the vector elements of the result vector register.

A shift circuit 140 may be provided for the pop instruction/op. The shift circuit 140 may left shift the stack register operand by the sum of the sizes in the size vector register (provided by the adder circuit 132). Thus, the shift circuit 140 may be coupled to the adder 132 and the V1 source operand. Alternatively, the shifter circuits 134A-134N may be configured to perform the shift for the pop op as well and the shift circuit 136 may not be needed. A compute n circuit 138 may be provided to compute the updated n for the pop instruction/op as well as the create and concat instructions/ops. The compute n circuit 138 may be coupled to the adder circuit 132 and may be receive the sum of the sizes of the vector elements (e.g., b3+b2+b1+b0) to compute n for the pop and create instructions/ops.

The create instruction/op may also be performed using the shift circuits 134A-134N, in an embodiment, to left shift the source vector elements to the MSB s of the result. For example, the x3 element may be left shifted by the vector element size (Vs) less the size of the x3 element (b3) (e.g., Vs-b3). The x2 element may be left shifted by twice the vector element size less the size of the x3 and x2 elements (e.g., 2Vs-(b3+b2)). Similarly, the x1 element may be left shifted by 3Vs-(b3+b2+b1) and the x0 element may be left shifted by 4Vs-(b3+b2+b1+b0). The resulting shifted values may be masked and logically ORed together to produce the output plurality of bits for the result stack register. Accordingly, the sums generated by the adder circuit 132 may be used by the shift circuits 134A-134N. The adder circuit 132 may be configured to generate the full shift amounts including the vector element sizes, or the shift circuits 134A-134N may account for the vector element sizes, explicitly or implicitly.

The concat instruction/op may be performed using the shift circuit 140 (to right shift the p2 bits by n1) and the compute n circuit 138 to add n1 and n2 to produce the output n. The shifted p2 may be logically ORed with the p1 bits to produce the output bits for the result stack register, for example.

The output select circuit 142 shown in FIG. 11 may be coupled to the mask circuits 136A-136N, the compute n circuit 138, and the shift circuit 140 and may be configured to select among the outputs based on the op being performed to provide an output to the register file 112. For example, the outputs of the mask circuits 136A-136N, concatenated together, may be selected for the top instruction whereas the output of the shift circuit 140 and the compute n circuit 138 may be selected for the pop, create, and concat instructions.

It is noted that the circuitry of FIG. 11 is merely one example of an implementation of a portion of the vector execution unit 118. Any other desired circuitry may be used. For example, the shift circuits may be rotate circuits. Any equivalents, including Boolean equivalents, of the circuitry shown may be used.

FIGS. 12-15 are flowcharts illustrating the operation of one embodiment of the processor 102/execution core 120/vector execution unit 118 to execute the various compression assist instructions described herein. While the blocks are shown in a particular order for ease of understanding, other orders may be used. Blocks may be performed in parallel in combinatorial logic circuitry in the processor 102/execution core 120/vector execution unit 118. Blocks, combinations of blocks, and/or the flowcharts as a whole may be pipelined over multiple clock cycles.

Figure 12:
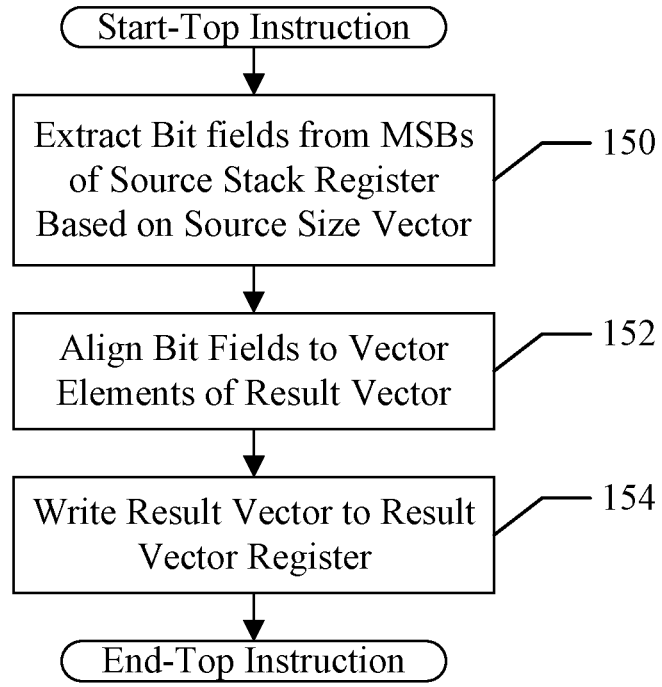
FIG. 12 is a flowchart illustrating operation of one embodiment of the processor to execute a top instruction.

FIG. 12 is a flowchart illustrating operation to execute the top instruction, for one embodiment. The processor 102/execution core 120/vector execution unit 118 may extract the bit fields from the MSBs of the source stack register based on the source size vector (block 150). For example, b3 of the MSBs may be extracted as x3, the next consecutive (adjacent) b2 MSBs may be extracted as x2, etc. The processor 102/execution core 120/vector execution unit 118 may align the bit fields to the vector elements of the result vector register (block 152). The extraction and alignment may be performed via shifting, as described above. Other embodiments may extract the bit fields in other ways. The processor 102/execution core 120/vector execution unit 118 may write the resulting vector to the result vector register (the vector register identified by the result operand) (block 154).

Figure 13:
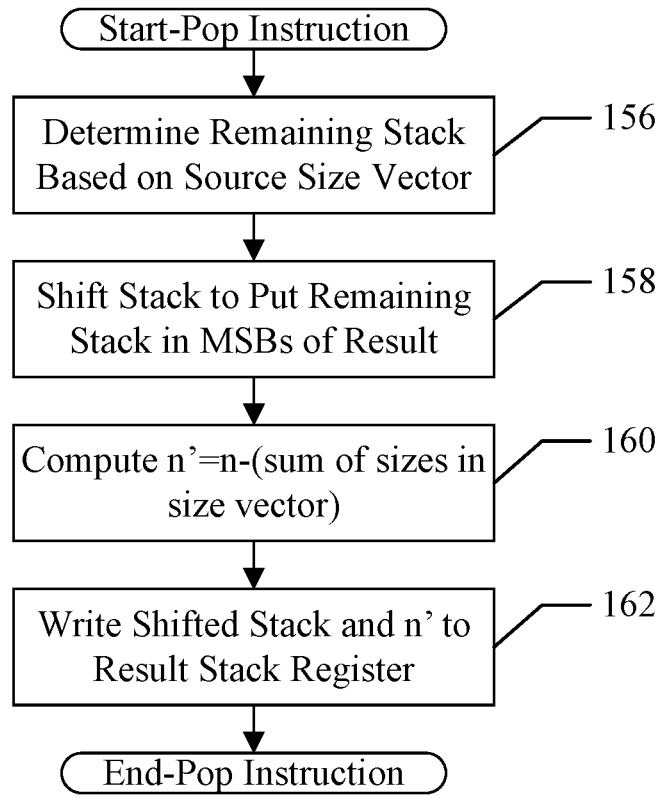
FIG. 13 is a flowchart illustrating operation of one embodiment of the processor to execute a pop instruction.

FIG. 13 is a flowchart illustrating operation to execution the pop instruction, for one embodiment. The processor 102/execution core 120/vector execution unit 118 may determine a remaining amount of the stack, based on the source size vector (block 156). For example, the processor 102/execution core 120/vector execution unit 118 may add the vector elements of the source size vector and determine that the remaining stack is the stack after a number of MSBs equal to the sum of the vector elements of the source size vector have been removed. The processor 102/execution core 120/vector execution unit 118 may shift the bit stack portion of the source stack operand to put the remaining stack in the MSBs of the result stack register (block 158). For example, the processor 102/execution core 120/vector execution unit 118 may left shift the source stack by the sum of the vector elements of the source size vector. The processor 102/execution core 120/vector execution unit 118 may compute n' as n from the source stack register minus the sum of the vector elements of the size vector (block 160) and may write the shifted stack and n' to the result stack register (block 162).

Figure 14:
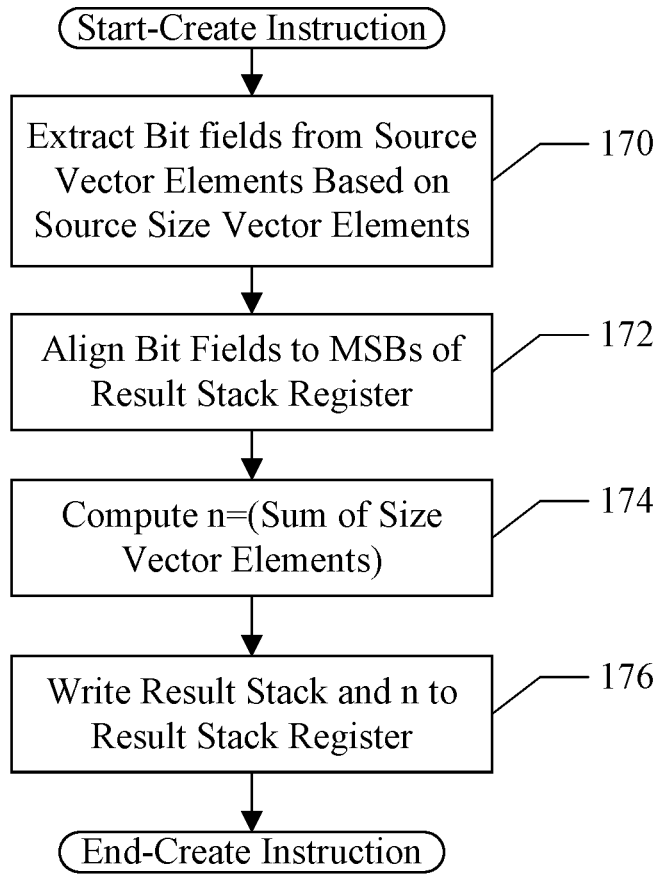
FIG. 14 is a flowchart illustrating operation of one embodiment of the processor to execute a create instruction.

FIG. 14 is a flowchart illustrating operation to execute the create instruction, for one embodiment. The processor 102/execution core 120/vector execution unit 118 may extract the bit fields from the source vector elements based on the source size vector elements (block 170). The processor 102/execution core 120/vector execution unit 118 may align the bit fields to the MSB s of the result register (block 172). The extraction and alignment may be performed by shifting, as previously discussed. Other embodiments may perform the extraction and alignment in other ways. Once the bit fields are aligned, they may be adjacent in the result register (e.g., the LSB of x3 may be adjacent to the MSB of x2, the LSB of x2 may be adjacent to the MSB of x1, etc.). The processor 102/execution core 120/vector execution unit 118 may compute n as the sum of the size vector elements (block 174) and may write the result stack (MSBs) and n (LSBs) to the result stack register (block 176).

Figure 15:
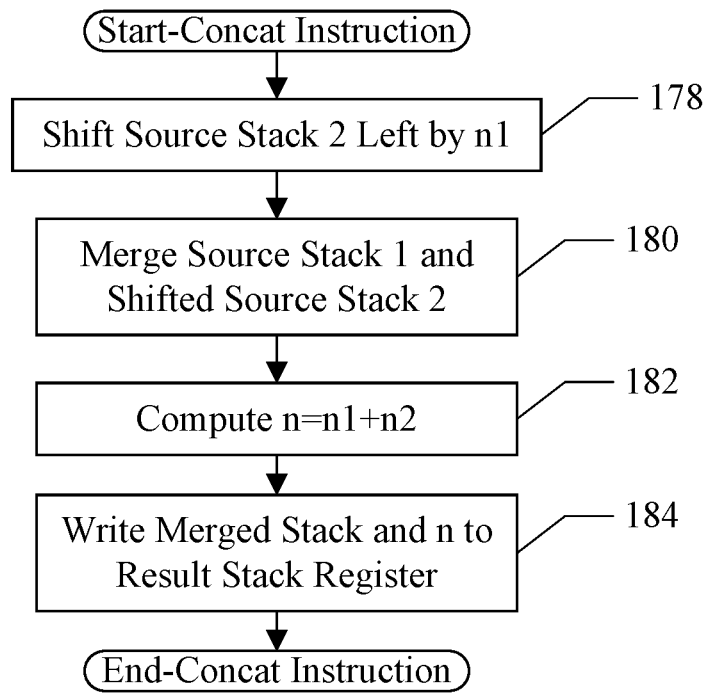
FIG. 15 is a flowchart illustrating operation of one embodiment of the processor to execute a concat instruction.

FIG. 15 is a flowchart illustrating operation to execute the concat instruction, for one embodiment. The processor 102/execution core 120/vector execution unit 118 may shift the stack portion of the stack source operand 2 left by n1 (the number of bits in the stack portion of the stat source operand 1) (block 178). The processor 102/execution core 120/vector execution unit 118 may merge the stack portion of the source stack 1 with the shifted source stack 2 field (block 180). The processor 102/execution core 120/vector execution unit 118 may compute n equal to the sum of n1 and n2 from the source stack register 1 and the source stack register 2, respectively (block 182). The processor 102/execution core 120/vector execution unit 118 may write the merged stack and n to the result stack register (block 184).

Numerous variations and modifications will become apparent to those skilled in the art once the above disclosure is fully appreciated. It is intended that the following claims be interpreted to embrace all such variations and modifications.

What is claimed is:

1. A processor comprising:
a register file comprising a plurality of registers; and
an execution core coupled to the register file, wherein:
the execution core is configured to execute a first instruction specifying a first operand in a first register in the register file, a second operand in a second register in the register file, and a result operand;
the first operand includes a first portion having a first plurality of bits and a second portion having a first bit count indicating a number of the first plurality of bits;
the second operand includes a third portion having a second plurality of bits and a fourth portion having a second bit count indicating a number of the second plurality of bits; and
the execution core is configured to concatenate the first plurality of bits and the second plurality of bits in a fifth portion of the result operand responsive to executing the first instruction.

2. The processor as recited in claim 1 wherein the execution core is configured to sum the first bit count and the second bit count and to write the sum to a sixth portion of the result operand responsive to executing the first instruction.

3. The processor as recited in claim 2 wherein:
the first register, the second register, and a third register storing the result operand are vector registers in the register file;
the execution core is configured to interpret bits in the first register as the first portion and the second portion instead of vector elements responsive to executing the first instruction;
the execution core is configured to interpret bits in the second register as the third portion and the fourth portion instead of vector elements responsive to executing the first instruction; and
the execution core is configured to interpret bits in the third register as the fifth portion and the sixth portion instead of vector elements responsive to executing the first instruction.

4. The processor as recited in claim 1 wherein:
the execution core comprises a shift circuit configured to right shift the second plurality of bits by the first bit count; and
the execution core is configured to merge the right-shifted second plurality of bits and the first plurality of bits to concatenate the first plurality of bits and the second plurality of bits in the fifth portion of the result operand.

5. The processor as recited in claim 4 wherein the execution core is configured to bit-wise logically OR the right-shifted second plurality of bits and the first plurality of bits to merge the right-shifted second plurality of bits and the first plurality of bits.

6. The processor as recited in claim 4 wherein the execution core comprises a compute circuit configured to sum the first bit count and the second bit count and to write the sum to a sixth portion of the result operand responsive to executing the first instruction.

7. The processor as recited in claim 1 wherein the execution core is configured to execute a second instruction specifying a first vector operand in a first vector register of the plurality of registers, a second vector operand in second vector register of the plurality of registers, and a second result operand, and wherein the execution core is configured to extract a plurality of bit fields from respective vector elements of the first vector operand responsive to values in respective vector elements of the second vector operand and to write the plurality of bit fields to the second result operand responsive to executing the second instruction.

8. The processor as recited in claim 7 wherein the execution core is configured to write the plurality of bit fields to adjacent bits in a seventh portion of the second result operand responsive to executing the second instruction.

9. The processor as recited in claim 8 wherein the execution core is configured to sum the values of the respective vector elements of the second vector operand and to write the sum to an eighth portion of the second result operand responsive to executing the second instruction.

10. The processor as recited in claim 7 wherein the execution core comprises:
a plurality of shift circuits configured to shift respective vector elements of the first vector operand based on values in respective vector elements of the second vector operand;
a plurality of mask circuits coupled to the plurality of shift circuits, wherein the plurality of mask circuits are configured to mask the shifted vector elements based on the respective vector elements of the second vector operand to generate variable-sized bit fields;
a circuit coupled to the plurality of mask circuits and configure to logically OR the variable-sized bit fields to generate a bit stream comprising a plurality of bit fields in adjacent bits; and
the execution core is configured to write the plurality of bit fields to the second result operand responsive to executing the second instruction.

11. The processor as recited in claim 10 further comprising an adder circuit configured to sum the values of the respective vector elements of the second vector operand, and the execution core is configured to write the sum to the second result operand responsive to executing the second instruction.

12. A method comprising:
executing a first instruction in a processor that is performing a decompression based, at least in part, on a bit stream that comprises a plurality of variable-sized bit fields, wherein at least a portion of the bit stream is stored in a first register in the processor, and wherein a first vector register comprises a plurality of vector elements into which sizes of the plurality of variable-sized bit fields have been stored, wherein executing the first instruction comprises extracting the plurality of variable-sized bit fields into respective vector elements of a result vector register; and
executing a second instruction in the processor, wherein the second instruction has the first register and the first vector register as operands, and wherein executing the second instruction comprises adding the vector elements of the first vector register to produce a sum, left shifting the bit stream in the first register by the sum, and writing the left-shifted bit stream to a result register.

13. The method as recited in claim 12 wherein the result register and the first register are a same register, whereby a remaining bit stream in the first register is updated to remove the variable-sized fields extracted during executing of the first instruction.

14. The method as recited in claim 12 further comprising reading a size of the bit stream from the first register, subtracting the sum from the size to generate an updated size, and writing the updated size to the result register.

15. The method as recited in claim 12 further comprising loading the first vector register with the sizes prior to executing the first instruction, updating the first vector register with additional sizes subsequent to executing the second instruction, and iterating the first and second instructions to extract additional variable-sized bit field from the bit stream.

16. A method comprising:
executing a first instruction in a processor that is performing a compression to generate, at least in part, a bit stream that comprises a plurality of variable-sized bit fields, wherein variable-sized bit fields for the bit stream are stored as vector elements in a first vector register and respective sizes of the variable-sized bit fields are stored as vector elements in a second vector register, wherein executing the first instruction comprises concatenating the variable-sized bit fields based on the respective sizes to for a portion of the bit stream and writing the bit stream to a result register of the first instruction; and
executing a second instruction in the processor, wherein the second instruction has the result register and a second register as operands, and the executing includes concatenating the portion of the bit stream in the result register and another bit stream in the second register to form a longer bit stream and writing the longer bit stream to a second result register.

17. The method as recited in claim 16 wherein executing the first instruction further comprises adding the respective sizes to generate a sum, and storing the sum in the result register as a size of the bit stream.

18. The method as recited in claim 17 wherein executing the second instruction further comprises adding the size of the bit stream from the result register and a second size of the other bit stream from the second register to generate a third size of the longer bit stream.

19. The method as recited in claim 18 further comprising writing the third size to the second register.

20. The method as recited in claim 17 wherein the result register, the second register, and the second result register are vector registers, but the processor is configured to interpret register bits in the result register, the second register and the second result register as bit streams due to their use as operands of the first and second instructions.

* * * * *